(12) United States Patent
Chang et al.

(10) Patent No.: US 9,430,609 B2
(45) Date of Patent: Aug. 30, 2016

(54) ELECTRONIC DEVICE AND METHOD FOR ANALYZING ADJOINING PARTS OF A PRODUCT

(75) Inventors: Chih-Kuang Chang, New Taipei (TW); Zhong-Kui Yuan, Shenzhen (CN); Li Jiang, Shenzhen (CN); Dong-Hai Li, Shenzhen (CN); Xiao-Guang Xue, Shenzhen (CN)

(73) Assignee: Zijilai Innovative Services Co., Ltd., Shenzhen (CN)

( * ) Notice: Subject to any disclaimer, the term of this patent is extended or adjusted under 35 U.S.C. 154(b) by 1273 days.

(21) Appl. No.: 13/336,007

(22) Filed: Dec. 23, 2011

(65) Prior Publication Data

US 2012/0232835 A1    Sep. 13, 2012

(51) Int. Cl.
*G01C 9/00*        (2006.01)
*G06F 17/50*       (2006.01)
*G06F 3/0346*      (2013.01)
*G06F 3/038*       (2013.01)
*G01B 11/30*       (2006.01)
*G01B 11/24*       (2006.01)

(52) U.S. Cl.
CPC ........... *G06F 17/5086* (2013.01); *G01B 11/24* (2013.01); *G01B 11/306* (2013.01); *G06F 3/038* (2013.01); *G06F 3/0346* (2013.01)

(58) Field of Classification Search
CPC .. G01B 11/306; G01B 11/24; G01B 21/045; G01B 5/008; G06F 15/00; G01C 15/00
USPC ......................................... 702/127, 150, 151
See application file for complete search history.

(56) References Cited

U.S. PATENT DOCUMENTS

| | | | | |
|---|---|---|---|---|
| 7,376,527 B2* | 5/2008 | Hikida | ................... | G01C 17/28 |
| | | | | 702/92 |
| 8,768,649 B2* | 7/2014 | Kitamura | ............... | G01C 17/38 |
| | | | | 324/244 |
| 9,207,076 B2* | 12/2015 | Chang | .................. | G01B 21/045 |

* cited by examiner

*Primary Examiner* — An Do
(74) *Attorney, Agent, or Firm* — Zhigang Ma (57) ABSTRACT

A scanner obtains point-cloud data of adjoining parts of a product. A computing device reads two point-clouds from the point-cloud data, fits two or more lines according to the two point-clouds, selects two lines that have the same ascending direction from the two or more lines, and creates a two-dimensional coordinates system base on the two selected lines. The computing device determines a highest point in each of the two point-clouds based on distances from each point in either of the point-clouds to a corresponding selected line, and determines two nearest points in the two point-clouds. A difference between Y coordinates of the two highest points is determined as a gap-height of two adjoining parts of the product, and a difference between X coordinates of the two nearest points is determined as a gap-width between two adjoining parts.

12 Claims, 6 Drawing Sheets

ELECTRONIC DEVICE AND METHOD FOR ANALYZING ADJOINING PARTS OF A PRODUCT

BACKGROUND

1. Technical Field

Embodiments of the present disclosure relates to computer aided design (CAD) technology, and more particularly, to an electronic device and a method for analyzing adjoining parts of a product.

2. Description of Related Art

An electronic device, such as a cell phone, is assembled from a plurality of parts. After assembly, gaps may exist between adjoining parts of the cell phone, which may be caused by lack of precision in production of the parts. To ensure precision of the product, the gaps between adjoining parts should be measured. However, at present, the measurement is done manually, which is time-consuming and leads to other potential errors.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, BLU-RAY, flash memory, and hard disk drives.

Figure 1:
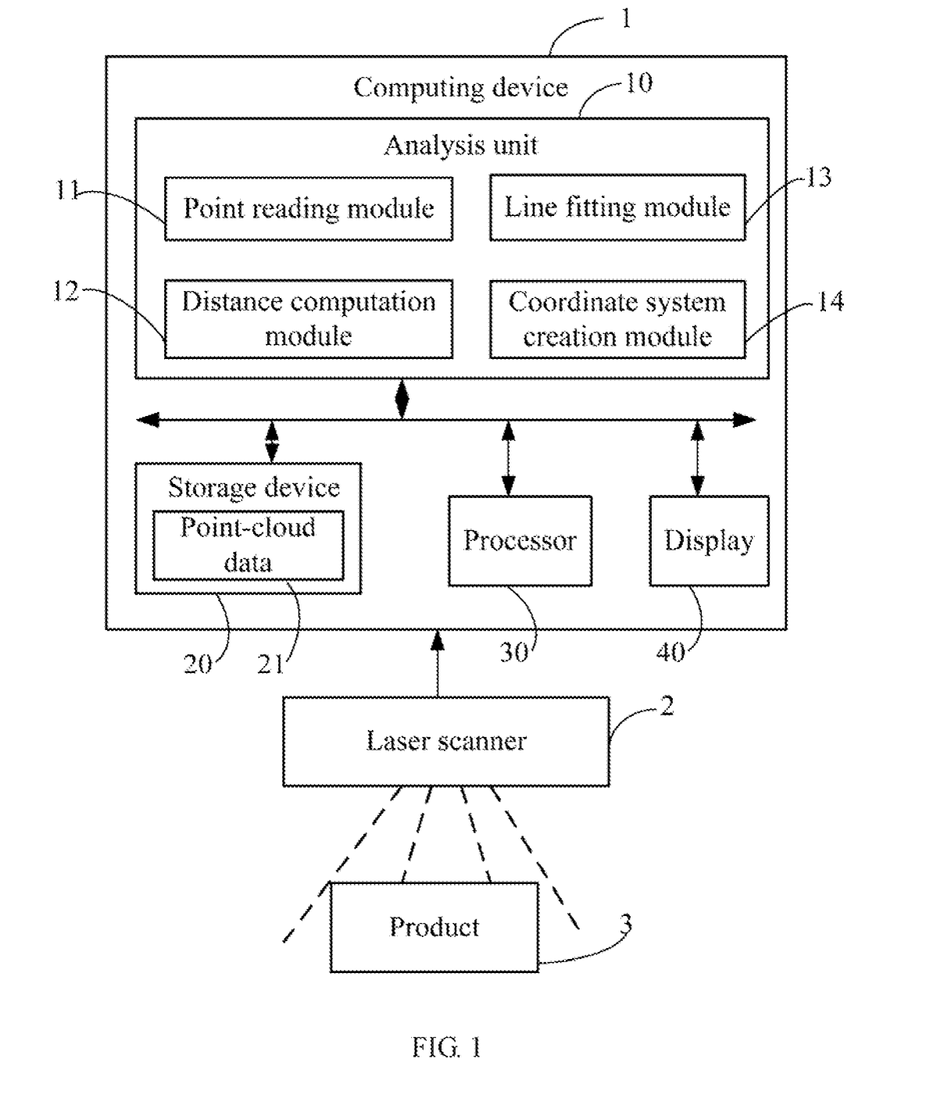
FIG. 1 is a block diagram of one embodiment of a computing device comprising an analysis unit.

FIG. 1 is a block diagram of one embodiment of a computing device 1 comprising an analysis unit 10. In one embodiment, the computing device 1 is electronically connected to a laser scanner 2. The laser scanner 2 is used to scan adjoining parts of a product 3 which is known as point-cloud data 21, which can be representative of three-dimensional coordinates of points of the adjoining parts. The electronic device 1 further includes a storage device 20, a processor 30, and a display 40. The storage device 20 stores the point-cloud data 21. The analysis unit 10 analyzes the point-cloud data, to determine any gap between adjoining parts and a height difference (or width difference) between two adjoining parts. The analysis unit 10, the storage device 20, the processor 30, and the display 40 communicate via a system or other bus.

As shown in FIG. 1, the analysis 10 includes a point reading module 11, a distance computation module 12, a line fitting module 13, and a coordinate system creation module 14. The modules 11-14 may comprise computerized code in the form of one or more programs (computer-readable program code) that are stored in the storage device 20. The computerized code includes instructions that are executed by the processor 30 to provide the functions of the modules 11-14 illustrated in FIG. 2a and FIG. 2b. The storage system 20 may be a cache or an independent or a dedicated memory. The computing device 1 may be a computer, or any other type of electronic device having a data processing function.

Figure 2A:
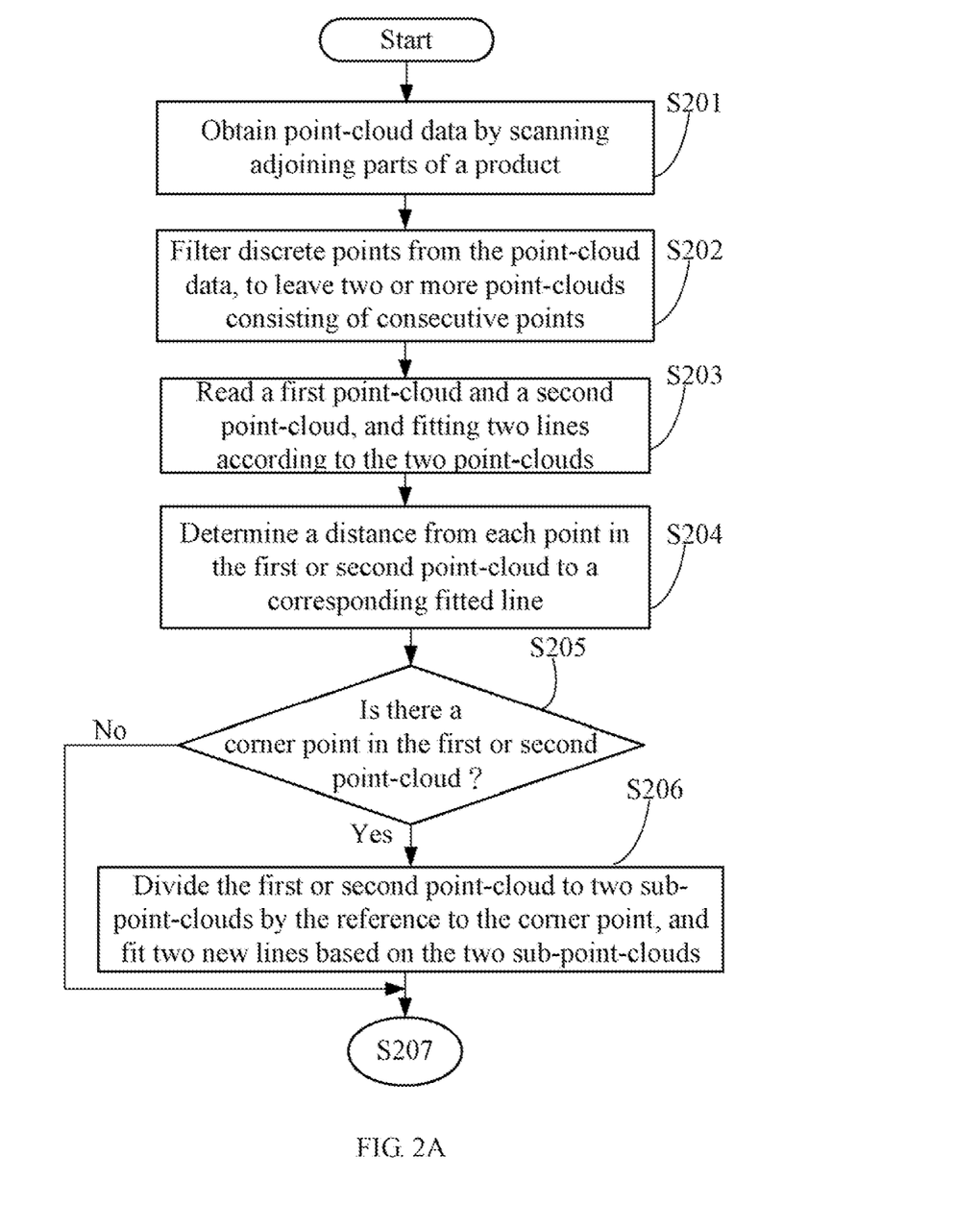
FIG. 2A and FIG. 2B are one flowchart of one embodiment of a method for analyzing adjoining parts of a product using the analysis unit in FIG. 1.
Figure 2B:
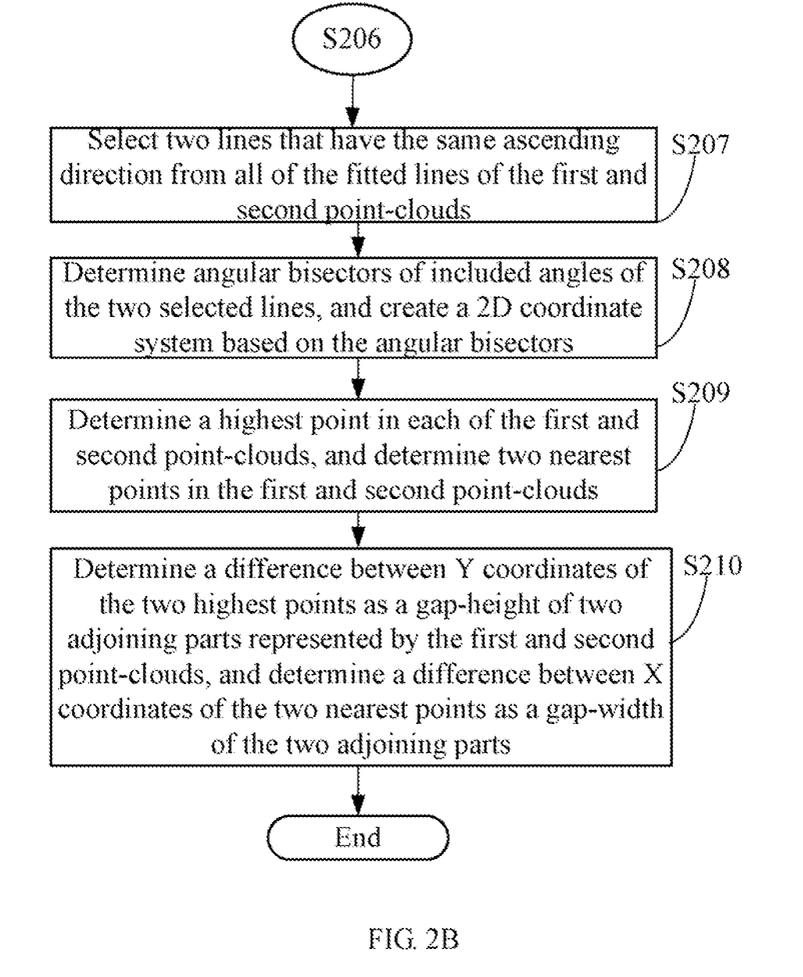

FIG. 2A and FIG. 2B are a flowchart of one embodiment of a method for analyzing adjoining parts of the product 3. Depending on the embodiment, additional steps may be added, others removed, and the ordering of the steps may be changed.

In step S201, the laser scanner 2 obtains point-cloud data 21 of the product 3 by scanning two or more adjoining parts of the product 3, and sends the point-cloud data 21 to the computing device 1. The computing device 1 displays the point-cloud data 21 on the display 40, and stores the point-cloud data 21 in the storage device 20. In one embodiment, the point-cloud data 21 may be shown as the point-clouds illustrated in FIG. 3.

Figure 3:
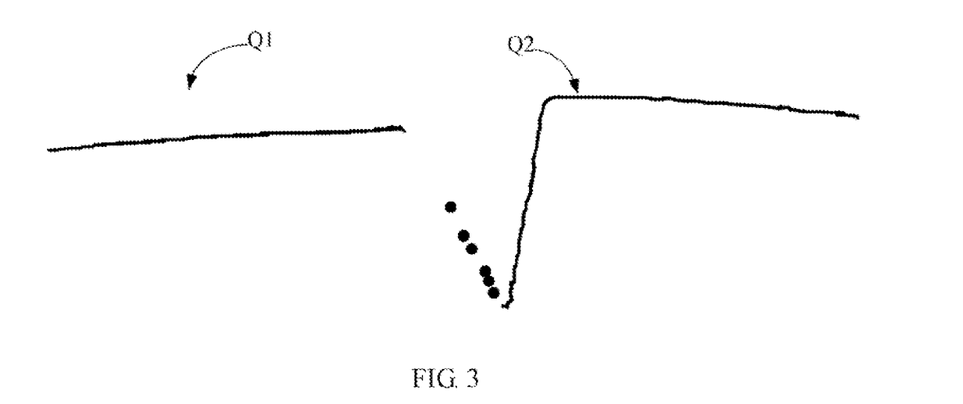
FIG. 3 is one embodiment illustrating point-clouds of a product.

In step 202, the point reading module 11 filters discrete points from the point-cloud data 21, to leave two or more point-clouds consisting of consecutive points. In one embodiment, the point reading module 11 determines the discrete points by determining whether a difference between X coordinates, or between Y coordinates, or between Z coordinates of each two adjoining points exceeds a threshold value. For example, the point-cloud data 21 may include a number N of points labeled from $P1(X1, Y1, Z1)$-$Pn(Xn, Yn, Zn)$ in sequence. Then, a threshold value Tx of an X coordinate of the point Pn may be defined as an average value AX of X coordinates of the prior $(n-1)$ points, a threshold value Ty of a Y coordinate of the point Pn may be defined as an average value AY of Y coordinates of the prior $(n-1)$ points, and a threshold value Tz of a Z coordinate of the point Pn may be defined as an average value AZ of Z coordinates of the prior $(n-1)$ points. If a difference in X coordinates, or in Y coordinates, or in Z coordinates of the point Pn and the point Pn-1 is more than the threshold value AX, or AY, or AZ, then the point Pn is determined as a discrete point. As shown in FIGS. 3, Q1 and Q2 represents two point-clouds consisting of consecutive points, and the other points are discrete points to be filtered.

Figure 4:
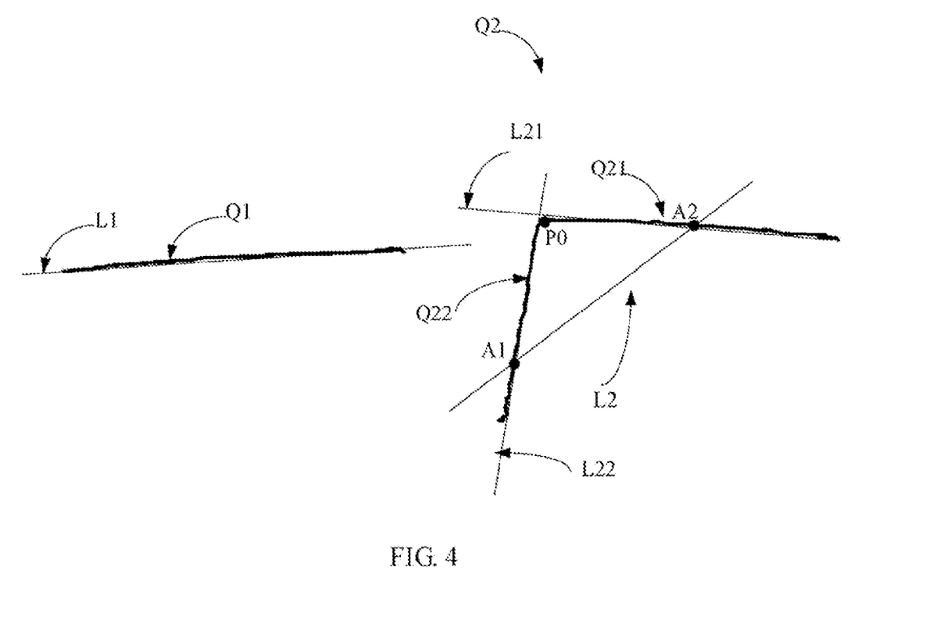
FIG. 4 is one embodiment illustrating fitting lines according to the point-clouds in FIG. 3.

In step 203, the line fitting module 13 reads a first point-cloud (such as the point-cloud Q1) and a second point-cloud (such as the point-cloud Q2) from the filtered point-cloud data 21, and fits two lines according to the two point-clouds. For example, as shown in FIG. 4, the line fitting module 13 fits a line L1 according to the point-cloud Q1, and fits a line L2 according to the point-cloud Q2.

In step S204, the distance computation module 14 computes a distance from each point in the two point-clouds to a corresponding fitted line. For example, a distance from each point in the point-cloud Q1 to the fitted line L1 is computed, and a distance from each point in the point-cloud Q2 to the fitted line L2 is computed.

In step S205, the distance computation module 14 determines if a corner point exists in either of the two point-clouds according to the computed distances. The corner point is determined as a point in a point-cloud that has a maximum distance to the fitted line of the point-cloud, and is between intersection points of the point-cloud and the fitted line of the point-cloud. For example, as shown in FIG. 4, a point P0 in the point-cloud Q2 has the maximum distance to the fitted line L2, and the point P0 is between the intersection points A1 and A2 of the point-cloud Q2 and the fitted line L2, therefore, the point P0 is determined as the corner point in the point-cloud Q2. If a point-cloud (such as the point-cloud Q1) has no corner point, the point-cloud does not need to be divided into sub-point-clouds, and step S207 is implemented. Otherwise, if a point-cloud (such as the point-cloud Q2) is determined to have the corner point, step S206 implemented for further dividing the point-cloud.

In step S206, the line fitting module 13 divides the point-cloud into two sub-point-clouds by reference to the corner point, and fits two new lines according to the two sub-point-clouds. For example, in FIG. 4, the point-cloud Q2 is divided into two sub-point-clouds Q21 and Q22 by the corner point P1, and two new lines are fitted according to the sub-point-clouds Q21 and Q22. Steps S204-S206 may be implemented to determine the corner points in the sub-point-clouds and further divide the sub-point-clouds for the fitting of new lines according to the sub-point-clouds, step S206 continues or is repeated until no corner point exists in all sub-point-clouds. Step S207 is implemented when step S206 terminates.

In step S207, the coordinate system creation module 14 selects two lines that have the same ascending direction from the fitted lines of the two point-clouds (including sub-point-clouds of the two point-clouds). Two lines which intersect may have four included angles. In one embodiment, if the minimum included angle of the two lines is less than a predetermined angle (e.g., 5 degrees), the two lines are determined as having the same ascending direction. The two lines L1 and L21 shown in FIG. 4 may be determined as having the same direction.

Figure 5:
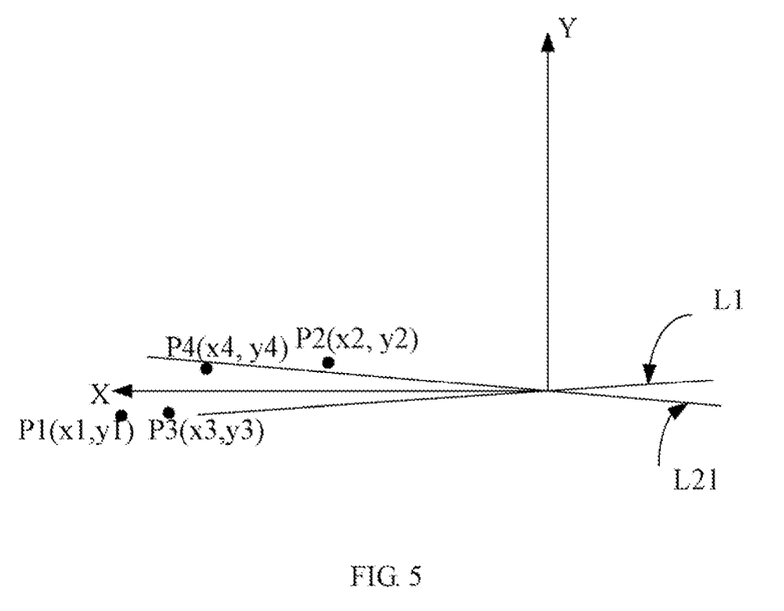
FIG. 5 is one embodiment illustrating creating a 2D coordinate system based on the fitted lines in FIG. 4.

In step S208, the coordinate system creation module 14 determines two angular bisectors of the included angles of the two lines, and creates a two-dimensional (2D) coordinate system by taking the two angular bisectors as an X-axis and a Y-axis of the 2D coordinate system. For example, as shown in FIG. 5, the 2D coordinate system is created according to the two angular bisectors of the included angles of the two lines L1 and L21.

In step S209, the distance computation module 12 determines a highest point in each of the two point-clouds. The highest point is defined as a point in the first point-cloud (or in the second point-cloud) that has the maximum distance to the corresponding selected line (such as the fitted line L1 or L21) compared to other points in the first point-cloud (or in the second point-cloud). For example, a first point P1(x1, y1) is determined as the highest point in the first point-cloud Q1, and a second point P2(x2, y2) is determined as the highest point in the sub-point-cloud Q21 of the second point-cloud Q2. The distance computation module 12 further determines two nearest points from the two point-clouds based on the two selected lines, such as a third point P3(x3, y3) in the first point-cloud Q1 and a fourth point P4(x4, y4) in the sub-point-cloud Q21.

In step S210, the distance computation module 12 determines a difference between Y coordinates of the two highest points as a gap-height of two adjoining parts of the product 3, and determines a difference between the X coordinates of the two nearest points as a gap-width between the two adjoining parts. For example, the difference of the Y coordinates of the two highest points P1 and P2 is |y2−y1|, and the difference of the X coordinates of the two nearest points P3 and P4 is |x4−x3|. Therefore, the two adjoining parts, respectively represented by the first and the second point-clouds, have a gap-height of |y2−y1| and a gap-width of |x4−x3|. The gap-height and the gap-width of the two adjoining parts of the product 3 are stored into the storage device 20, and may be displayed on the display 40.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A method being executed by a processor of a computing device for analyzing adjoining parts of a product, the method comprising:

reading two point-clouds of two adjoining parts of the product from a storage device, and fitting two lines according to the two point-clouds;

computing a distance from each point in the two point-clouds to a corresponding fitted line, and determining if a corner point exists in either of the two point-clouds according to the distances, wherein the corner point is a point in a point-cloud that has a maximum distance to the fitted line of the point-cloud, and is between intersection points of the point-cloud and the fitted line of the point-cloud;

dividing the point-cloud to two sub-point-clouds by reference to the corner point, and fitting two new lines according to the two sub-point-clouds, in response that a corner point exists in a point-cloud;

selecting two lines that have the same ascending direction from all of the fitted lines, wherein a minimal included angle of the two lines that have the same ascending direction is less than a predetermined angle;

determining two angular bisectors of included angles of the two selected lines, and taking the two angular bisectors as an X-axis and a Y-axis of a two-dimensional (2D) coordinate system;

determining a highest point in each of the two point-clouds and two nearest points from the two point-clouds based on the two selected lines, wherein a highest point in a point-cloud is a point in the point-cloud hat has the maximum distance to the corresponding selected line compared to other points in the point-cloud; and determining a difference between Y coordinates of the two highest points as a gap-height of the two adjoining parts of the product, and determining a difference between X coordinates of the two nearest points as a gap-width of the two adjoining parts.

2. The method of claim 1, wherein before the step of reading two point-clouds the method further comprises steps of:

reading point-cloud data of two or more adjoining parts of the product obtained by a scanner; and filtering discrete points from the point-cloud data to leave two or more point-clouds consisting of consecutive points, wherein the discrete points is determined by whether a difference between X coordinates, or Y coordinates, or Z coordinates of each two adjoining points in the point-cloud data exceeds a corresponding threshold value.

3. The method of claim 2, wherein a threshold value Tx of an X coordinate of a point Pn in the point-cloud data is defined as an average value of X coordinates of prior (n−1)

points, a threshold value Ty of a Y coordinate of the point Pn is defined as an average value of Y coordinates of the prior (n−1) points, and a threshold value Tz of a Z coordinate of the point Pn is defined as an average value of Z coordinates of the prior (n−1) points.

4. The method of claim 3, wherein if a difference between X coordinates, or Y coordinates, or Z coordinates of the point Pn and the point Pn−1 is more than the threshold value Tx, Ty, or Tz, the point Pn is determined as a discrete point.

5. A non-transitory storage medium storing a set of instructions, the set of instructions capable of being executed by a processor of a computing device to perform a method for analyzing adjoining parts of a product, the method comprising:
  reading two point-clouds of two adjoining parts of the product from a storage device, and fitting two lines according to the two point-clouds;
  computing a distance from each point in the two point-clouds to a corresponding fitted line, and determining if a corner point exists in either of the two point-clouds according to the distances, wherein the corner point is a point in a point-cloud that has a maximum distance to the fitted line of the point-cloud, and is between intersection points of the point-cloud and the fitted line of the point-cloud;
  dividing the point-cloud to two sub-point-clouds by reference to the corner point, and fitting two new lines according to the two sub-point-clouds, in response that a corner point exists in a point-cloud;
  selecting two lines that have the same ascending direction from all of the fitted lines, wherein a minimal included angle of the two lines that have the same ascending direction is less than a predetermined angle;
  determining two angular bisectors of included angles of the two selected lines, and taking the two angular bisectors as an X-axis and a Y-axis of a two-dimensional (2D) coordinate system;
  determining a highest point in each of the two point-clouds and two nearest points from the two point-clouds based on the two selected lines, wherein a highest point in a point-cloud is a point in the point-cloud hat has the maximum distance to the corresponding selected line compared to other points in the point-cloud; and
  determining a difference between Y coordinates of the two highest points as a gap-height of two adjoining parts of the product, and determining a difference between X coordinates of the two nearest points as a gap-width of the two adjoining parts.

6. The medium of claim 5, wherein before the step of reading two point-clouds the method further comprises steps of:
  reading point-cloud data of two or more adjoining parts of the product obtained by a scanner; and
  filtering discrete points from the point-cloud data to leave two or more point-clouds consisting of consecutive points, wherein the discrete points is determined by whether a difference between X coordinates, or Y coordinates, or Z coordinates of each two adjoining points in the point-cloud data exceeds a corresponding threshold value.

7. The medium of claim 6, wherein a threshold value Tx of an X coordinate of a point Pn in the point-cloud data is defined as an average value of X coordinates of prior (n−1) points, a threshold value Ty of a Y coordinate of the point Pn is defined as an average value of Y coordinates of the prior (n−1) points, and a threshold value Tz of a Z coordinate of the point Pn is defined as an average value of Z coordinates of the prior (n−1) points.

8. The medium of claim 7, wherein if a difference between X coordinates, or Y coordinates, or Z coordinates of the point Pn and the point Pn−1 is more than the threshold value Tx, Ty, or Tz, the point Pn is determined as a discrete point.

9. A computing device, comprising:
  a storage device;
  a processor:
  one or more programs that are stored in the storage device and being executed by the at least one processor, the one or more programs comprising:
    a point reading module operable to read two point-clouds of a joint part of two adjoining parts of the product from a storage device;
    a line fitting module operable to fit two lines according to the two point-clouds;
    a distance computation module operable to compute a distance from each point in the two point-clouds to a corresponding fitted line, and determine if a corner point exists in either of the two point-clouds according to the distances, wherein the corner point is a point in a point-cloud that has a maximum distance to the fitted line of the point-cloud, and is between intersection points of the point-cloud and the fitted line of the point-cloud;
    the line fitting module further operable to divide the point-cloud to two sub-point-clouds by reference to the corner point, and fit two new lines according to the two sub-point-clouds, in response that a corner point exists in a point-cloud;
    a coordinate system creation module operable to select two lines that have the same ascending direction from all of the fitted lines, determine two angular bisectors of included angles of the two selected lines, and take the two angular bisectors as an X-axis and a Y-axis of a two-dimensional (2D) coordinate system, wherein a minimal included angle of the two lines that have the same ascending direction is less than a predetermined angle; and
    the distance computation module further operable to determine a highest point in each of the two point-clouds and two nearest points from the two point-clouds based on the two selected lines, determine a difference between Y coordinates of the two highest points as a gap-height of two adjoining parts of the product, and determine a difference between X coordinates of the two nearest points as a gap-width of the two adjoining parts, wherein a highest point in a point-cloud is a point in the point-cloud hat has the maximum distance to the corresponding selected line compared to other points in the point-cloud.

10. The computing device of claim 9, wherein before read the two point-clouds the point reading module is further operable to:
  read point-cloud data of two or more adjoining parts of the product obtained by a scanner; and
  filter discrete points from the point-cloud data to leave two or more point-clouds consisting of consecutive points, wherein the discrete points is determined by whether a difference between X coordinates, or Y coordinates, or Z coordinates of each two adjoining points in the point-cloud data exceeds a corresponding threshold value.

11. The computing device of claim 10, wherein a threshold value Tx of an X coordinate of a point Pn in the point-cloud data is defined as an average value of X coordinates of prior (n−1) points, a threshold value Ty of a Y coordinate of the point Pn is defined as an average value of Y coordinates of the prior (n−1) points, and a threshold value Tz of a Z coordinate of the point Pn is defined as an average value of Z coordinates of the prior (n−1) points.

12. The computing device of claim 11, wherein if a difference between X coordinates, or Y coordinates, or Z coordinates of the point Pn and the point Pn−1 is more than the threshold value Tx, Ty, or Tz, the point Pn is determined as a discrete point.

* * * * *